United States Patent
Tokuda et al.

(10) Patent No.: US 8,368,311 B2
(45) Date of Patent: Feb. 5, 2013

(54) ORGANIC ELECTROLUMINESCENT DISPLAY DEVICE

(75) Inventors: Naoki Tokuda, Mobara (JP); Hiroshi Kageyama, Hachioji (JP); Masamitsu Furuie, Mobara (JP)

(73) Assignees: Hitachi, Displays, Ltd., Chiba-ken (JP); Panasonic Liquid Crystal Display Co., Ltd., Hyogo-ken (JP)

( * ) Notice: Subject to any disclaimer, the term of this patent is extended or adjusted under 35 U.S.C. 154(b) by 0 days.

(21) Appl. No.: 13/542,150

(22) Filed: Jul. 5, 2012

(65) Prior Publication Data

US 2012/0274223 A1 Nov. 1, 2012

Related U.S. Application Data

(63) Continuation of application No. 11/710,944, filed on Feb. 27, 2007, now Pat. No. 8,242,698.

(30) Foreign Application Priority Data

Feb. 27, 2006 (JP) .................................. 2006-051235

(51) Int. Cl.
*H05B 37/00* (2006.01)

(52) U.S. Cl. ...................... 315/160; 315/167; 315/169.3; 315/169.4

(58) Field of Classification Search ................... 315/160, 315/161, 164, 167, 169.4; 345/211, 212
See application file for complete search history.

(56) References Cited

U.S. PATENT DOCUMENTS 6,903,513 B2    6/2005   Choi et al.

FOREIGN PATENT DOCUMENTS

| JP | 2002-108252 | 4/2002 |
| JP | 2004-349064 | 12/2004 |

*Primary Examiner* — Douglas W Owens
*Assistant Examiner* — Jianzi Chen
(74) *Attorney, Agent, or Firm* — Stites & Harbison, PLLC; Juan Carlos A. Marquez, Esq.; Nicholas B. Trenkle

(57) ABSTRACT

The present invention overcomes image defects such as the brightness inclination or smears by reducing the line resistance of a power source bus line which supplies electricity to organic EL elements. A plurality of pixels which are arranged in a matrix array is connected to power source lines, and the plurality of power source lines are connected to a power source bus line. Both ends of the power source bus line are connected to a power source part via a FPC. By supplying electricity to both ends of the power source bus line from the power source part, the line resistance of the power source bus line can be reduced.

4 Claims, 8 Drawing Sheets

ORGANIC ELECTROLUMINESCENT DISPLAY DEVICE

CROSS-REFERENCE TO RELATED APPLICATIONS

This application is a Continuation of U.S. application Ser. No. 11/710,944 filed on Feb. 27, 2007. Priority is claimed based on U.S. application Ser. No. 11/710,944 filed on Feb. 27, 2007, which claims priority from Japanese application JP 2006-051235 filed on Feb. 27, 2006, which is hereby incorporated by reference into this application.

BACKGROUND

1. Field of the Invention

The present invention relates to an organic EL display device which uses organic EL elements as pixels, and more particularly to an improved power source wiring which supplies electricity for allowing the organic EL elements to emit light.

2. Description of the Related Art

An organic EL element is a current-light-emitting-type element which emits light when an electric current flows therethrough, wherein a large current of several tens to 100 mA flows in a power source line in the inside of a TFT substrate on which the organic EL elements are formed. Particularly, in performing fixed-voltage driving of an EL display panel, when electricity is supplied to respective pixels via the power source line in the inside of the TFT substrate from a terminal at an inlet of the display panel, due to a voltage drop which is generated attributed to the resistance of the power source line, image defects such as the brightness inclination, smears and the like are generated. Accordingly, it is necessary to reduce the resistance of the power source line in the inside of the TFT substrate (from the inlet of the display panel to the respective pixels).

With respect to the reduction of the power source resistance, in following patent document 1, there is described a technique in which, for lowering a voltage drop attributed to the resistance of a drive power source line which drives a plurality of organic EL elements arranged in a matrix array, auxiliary power source lines are connected to both ends (and an intermediate portion) of a drive power source line.

Patent document 1: JP-A-2003-108068

SUMMARY

In the above-mentioned patent document 1, although the voltage drop of the drive power source line which is connected to a plurality of organic EL elements is lowered, a voltage drop of the auxiliary power source lines which are connected to the plurality of drive power source lines is not taken into consideration.

Accordingly, it is an object of the present invention to provide an organic EL display device which reduces a voltage drop of a power source bus line which supplies electricity to a power source line which is connected to a plurality of organic EL elements.

The present invention is directed to an organic EL display device which includes a power source line which is connected to a plurality of organic EL elements and a power source bus line which is connected to the power source line, wherein electricity is supplied to a plurality of portions including both ends of the power source bus line or both ends of the power source bus line.

According to the present invention, it is possible to obtain the organic EL display device which can reduce the voltage drop attributed to the line resistance of the power source bus line which supplies electricity to the power source line of the organic EL elements thus effectively overcoming image defects such as the brightness inclination, smears or the like attributed to the power source bus line.

The display device according to the present invention is applicable to a TV receiver set, a PC monitor, a notebook type PC, a PDA, a mobile phone, a digital still camera, a digital video camera, a car navigation monitor and the like. Further, the display device according to the present invention is also applicable to other self-luminous light-emitting-type display.

DETAILED DESCRIPTION OF THE INVENTION

Figure 1:
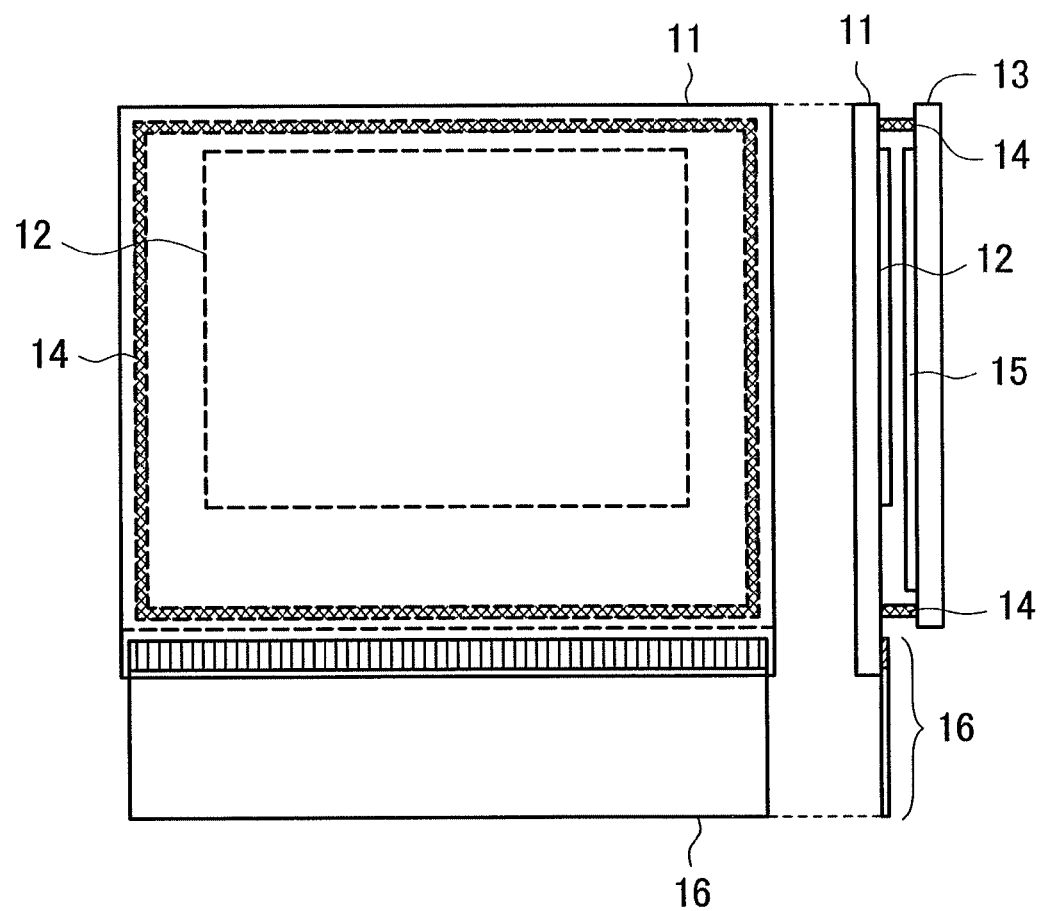
FIG. 1 is a general appearance view of an organic EL display device according to the present invention.

Hereinafter, the present invention is explained in conjunction with embodiments by reference to drawings.

Embodiment 1

FIG. 1A and FIG. 1B are general appearance views of an organic EL display device according to the present invention, wherein FIG. 1A is a front view and FIG. 1B is a cross-sectional view. In FIG. 1A and FIG. 1B, a pixel part 12 is formed on a TFT substrate (display panel) 11, and the pixel part 12 is sealed by the TFT substrate 11, a sealing substrate 13 which faces the TFT substrate 11, and a sealing material 14. In a sealed space, for preventing the degradation of organic EL elements in the pixel part 12 attributed to moisture, a desiccant material 15 is sealed. Further, on the TFT substrate 11, a FPC (Flexible Printed Circuit) 16 for supplying signal for driving the organic EL elements and for supplying electricity from a power source part is mounted.

Figure 2:
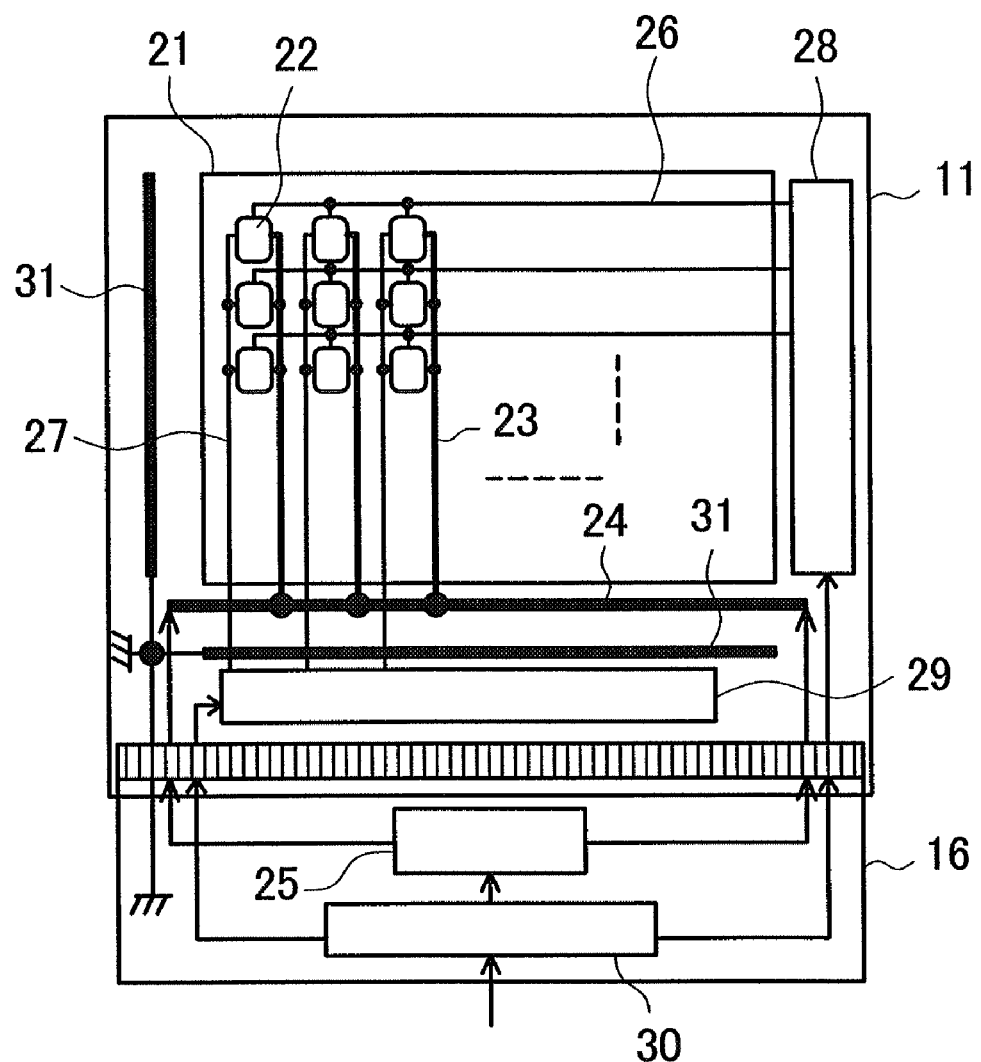
FIG. 2 is a drive circuit diagram of the organic EL display device of an embodiment 1 shown in FIG. 1.

FIG. 2 is a drive circuit diagram of the organic EL display device shown in FIG. 1. In FIG. 2, pixels 22 each of which is formed of the organic EL element are arranged in a matrix array in a display region 21. The plurality of pixels 22 are connected to power source lines 23 and the plurality of power source lines 23 are connected to a power source bus line 24. Both ends of the power source bus line 24 are connected to a power source part 25 via the FPC 16. In this manner, the organic EL elements in the pixels 22 emit light with the electricity supplied to both ends of the power source bus line 24 from the power source part 25.

Further, the plurality of pixels 22 which are arranged in a matrix array are connected to scanning lines 26 and data lines 27, and are driven in response to scanning signals of the scanning lines 26 selected by a scanning line drive circuit 28 and data signals from the data lines 27 which are connected to a data line drive circuit 29.

A display control part 30 receives signals from the outside and supplies the scanning signals and the data signals to the scanning line drive circuit 28 and the data line drive circuit 29 via the FPC 16 and, at the same time, controls the power source part 25. Although the power source part 25 and the display control part 30 are mounted on the FPC 16 in the drawing, it is not always necessary to mount the power source part 25 and the display control part 30 on the FPC 16.

Here, a cathode contact 31 is connected to cathodes of the organic EL elements in the pixels 22, wherein the cathode contact 31 is grounded to the TFT substrate 11 and, at the same time, is grounded to the FPC 16 via the FPC 16.

Figure 3:
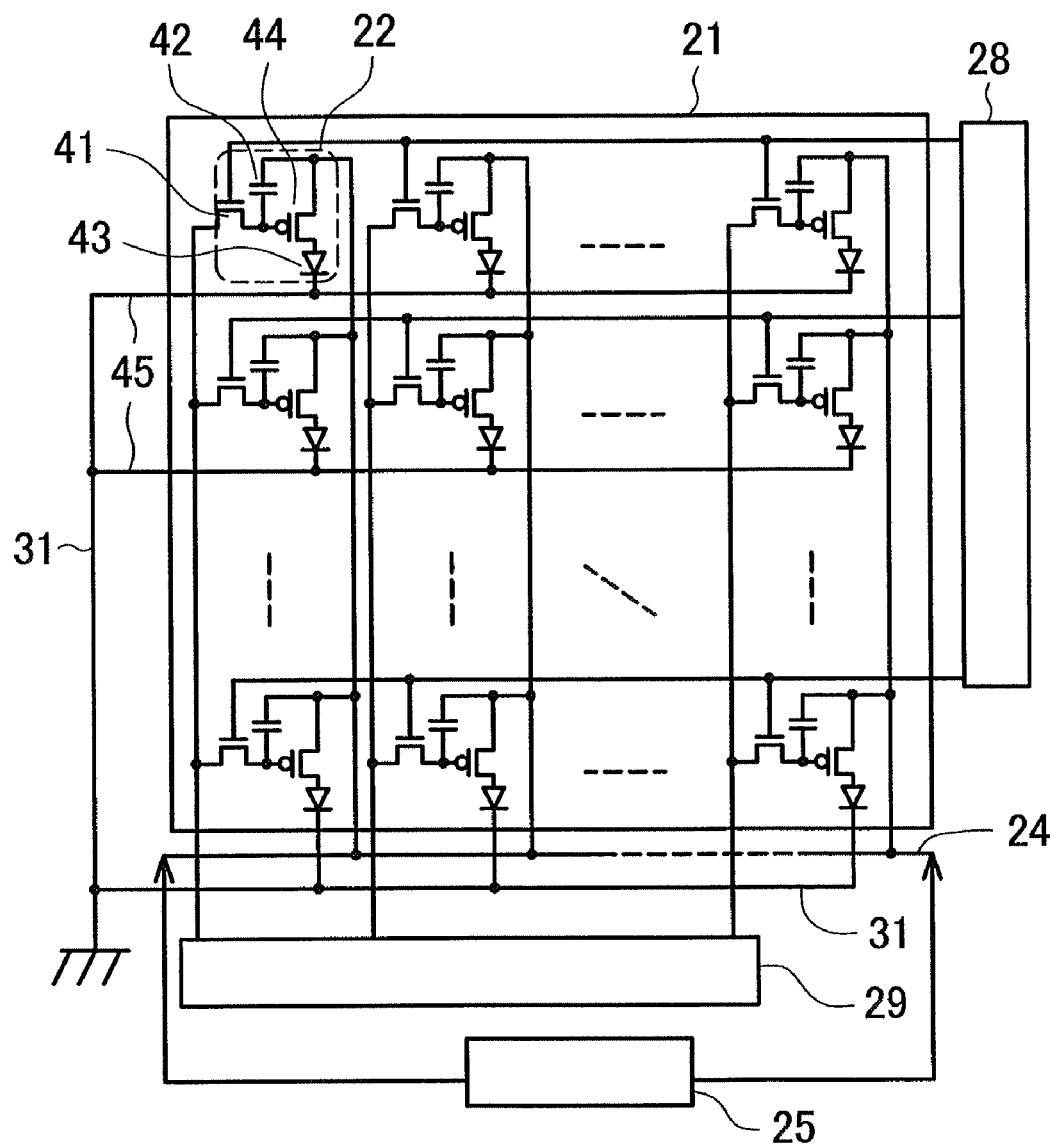
FIG. 3 is a detailed view of a pixel made of an organic EL element shown in FIG. 2.

FIG. 3 is a detailed view of the pixels 22 each of which is constituted of the organic EL element shown in FIG. 2. In FIG. 3, in each one of the plurality of pixels 22 arranged in the inside of the display region 21, a switching TFT 41 which is selected by the scanning line drive circuit 28 and acquires the data signals from the data line drive circuit 29, a capacitance 42 which stores the data signals, and a driver TFT 44 which drives the organic EL element 43 in response to the data signals are provided. The power source part 25 is connected to both ends of the power source bus line 24.

The organic EL element 43 has an anode side thereof connected to the driver TFT 44 and a cathode side thereof connected to a cathode current line 45 which holds a reference potential (ground potential), and the cathode current line 45 is connected to the cathode contact 31.

In this embodiment, electricity is supplied from both ends of the power source bus line 24 and hence, compared to the supply of electricity from one terminal, it is possible to lower a voltage drop attributed to the line resistance of the power source bus line 24. By lowering the voltage drop in this manner, it is possible to reduce the brightness inclination in the horizontal direction of the horizontal power source bus line 24. Here, the brightness inclination in the vertical direction attributed to the voltage drop of the vertical power source line 23 is ignored.

Embodiment 2

Figure 4:
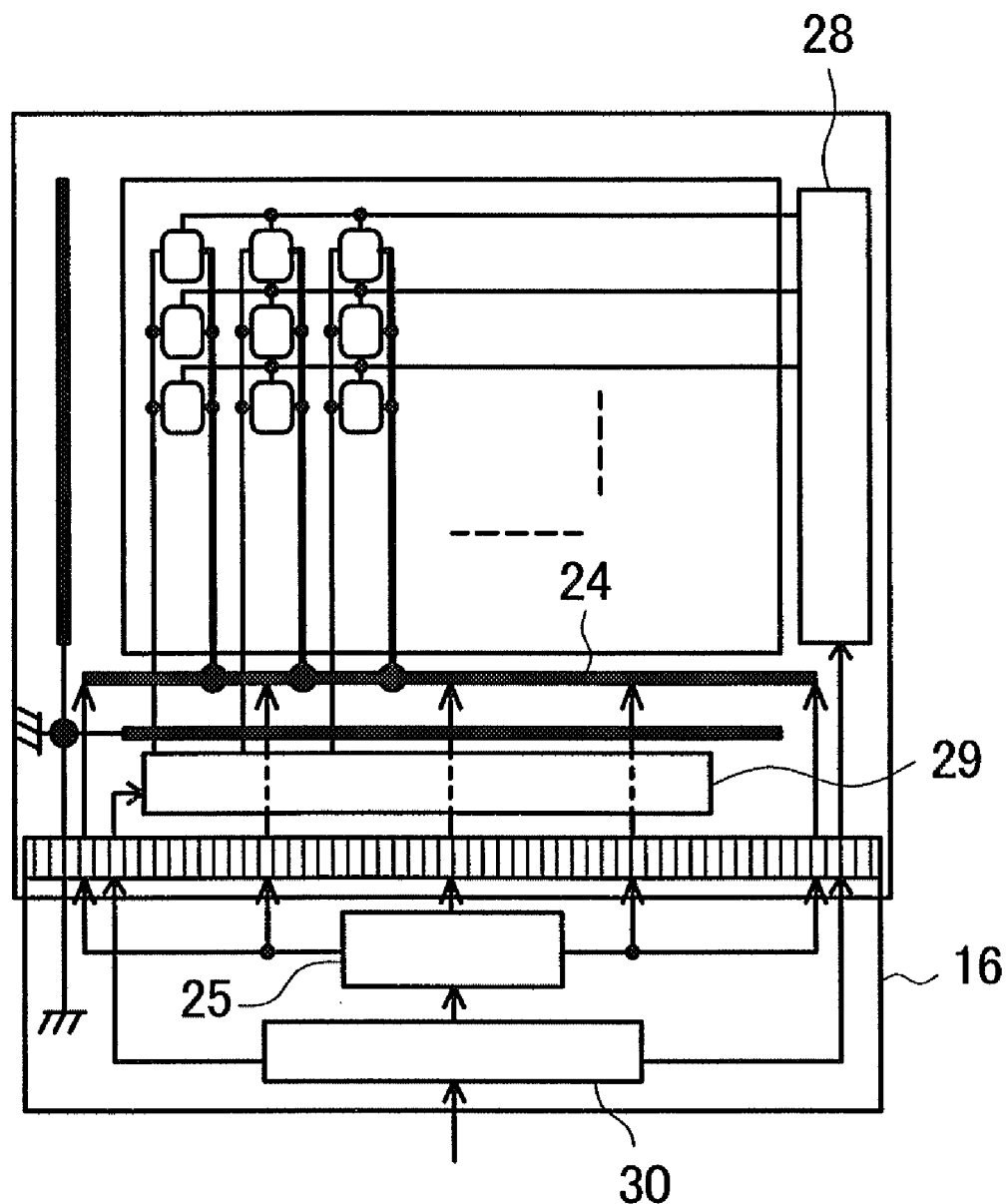
FIG. 4 is a drive circuit diagram of an organic EL display device of the second embodiment.

FIG. 4 is a drive circuit diagram of an organic EL display device of an embodiment 2 corresponding to FIG. 2 of the embodiment 1. The constitution which makes this embodiment differ from the embodiment 1 lies in that electricity is supplied to a plurality of portions including both ends of the power source bus line 24. Since other constitutions are substantially equal to the corresponding constitutions shown in FIG. 2, the detailed explanation is omitted.

In FIG. 4, electricity is supplied to the plurality of portions (five portions) including both ends of the power source bus line 24 from a power source part 25 on the FPC 16 side. By supplying electricity to the plurality of portions in this manner, the line resistance of the power source bus line 24 is divided thus achieving the substantial reduction of line resistance.

In this embodiment, compared to the embodiment 1, a voltage drop attributed to the line resistance of the power source bus line 24 can be further lowered thus further reducing the brightness inclination.

Embodiment 3

Figure 5:
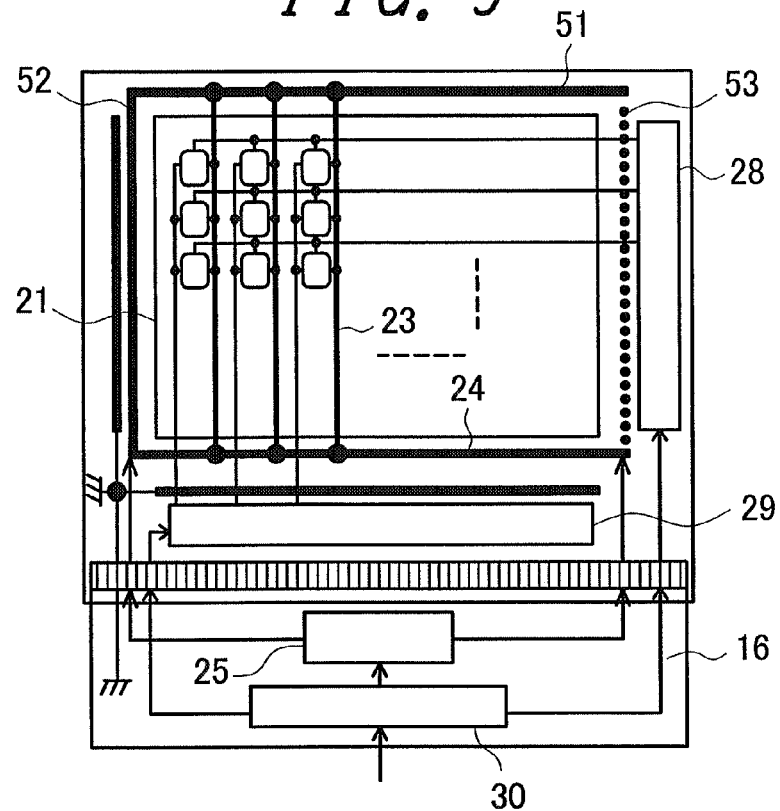
FIG. 5 is a drive circuit diagram of an organic EL display device of the third embodiment.

FIG. 5 is a drive circuit diagram of an organic EL display device of an embodiment 3 corresponding to FIG. 2 of the embodiment 1. The constitution which makes this embodiment differ from the embodiment 1 lies in that a drive circuit includes an upper power source bus line 51 and left and right power source bus lines 52, 53. Since other constitutions are substantially equal to the corresponding constitutions shown in FIG. 2, the detailed explanation is omitted.

In FIG. 5, one ends of a plurality of power source lines 23 are connected to a lower power source bus line 24, and another ends of the plurality of power source lines 23 are connected to the upper power source bus line 51. Further, the lower power source bus line 24 and the upper power source bus line 51 are connected with the left power source bus line 52. Further, the right power source bus line 53 may be connected to the lower power source bus line 24 and the upper power source bus line 51 so as to surround the display region 21 with these power source bus lines.

Electricity is supplied to both ends of the power source bus line 24 from a power source part 25 on the FPC 16 side and, at the same time, electricity is also supplied to the upper power source bus line 51 via the left power source bus line 52 (and the right power source bus line 53). By supplying electricity from both ends of the power source line 23 in this manner, it is possible to lower a voltage drop of the power source line 23.

In this embodiment, along with the lowering of the voltage drop of the power source bus line 24, the voltage drop of the power source line 23 can be lowered and hence, the brightness inclination in the horizontal direction can be reduced in the same manner as the embodiment 1 and, further, the brightness inclination in the vertical direction attributed to the line resistance of the power source line 23 can be also reduced.

Embodiment 4

Figure 6:
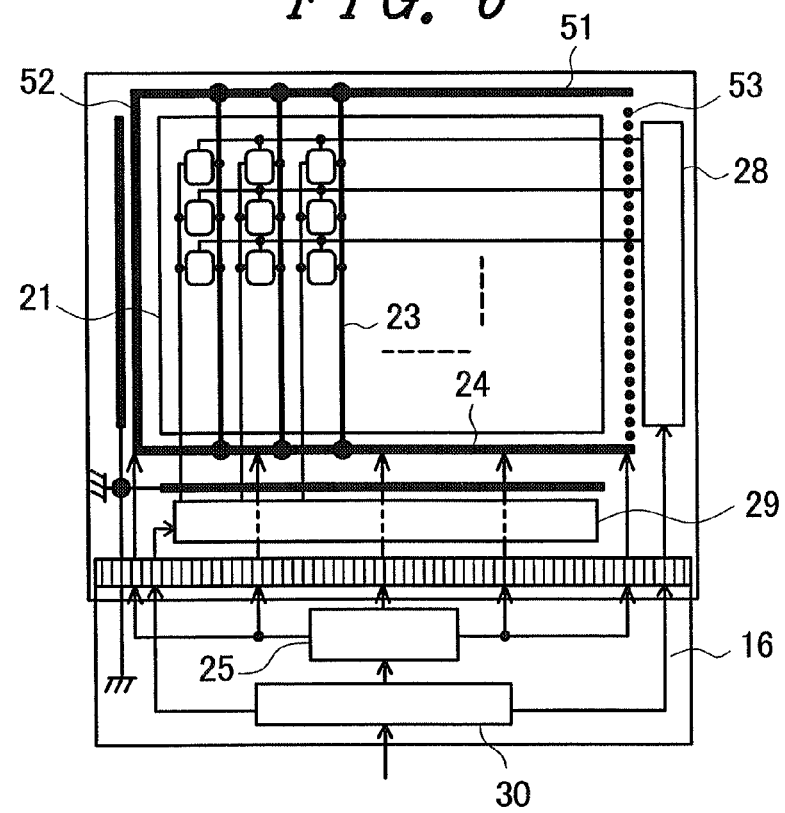
FIG. 6 is a drive circuit diagram of an organic EL display device of the fourth embodiment.

FIG. 6 is a drive circuit diagram of an organic EL display device of an embodiment 4 corresponding to FIG. 4 of the embodiment 2. The constitution which makes this embodiment differ from the embodiment 2 lies in, in the same manner as FIG. 5 of the embodiment 3, that a drive circuit includes an upper power source bus line 51 and left and right power source bus lines 52, 53. Since other constitutions are substantially equal to the corresponding constitutions shown in FIG. 4, the detailed explanation is omitted.

In FIG. 6, electricity is supplied to a plurality of portions (five portions) including both ends of the power source bus line 24 from a power source part 25 on the FPC 16 side and, at the same time, electricity is also supplied to the upper power source bus line 51 via the left power source bus line 52 (and the right power source bus line 53). By supplying electricity to both ends of the power source line 23 from the power source bus line 24 and the upper power source bus line 51, a voltage drop of the power source line 23 is lowered.

In this embodiment, along with the further lowering of the voltage drop of the power source bus line 24, the voltage drop of the power source line 23 can be also lowered and hence, the brightness inclination in the horizontal direction can be further reduced in the same manner as the embodiment 2, the brightness inclination in the vertical direction attributed to the line resistance of the power source line 23 can be also reduced.

Embodiment 5

Figure 7:
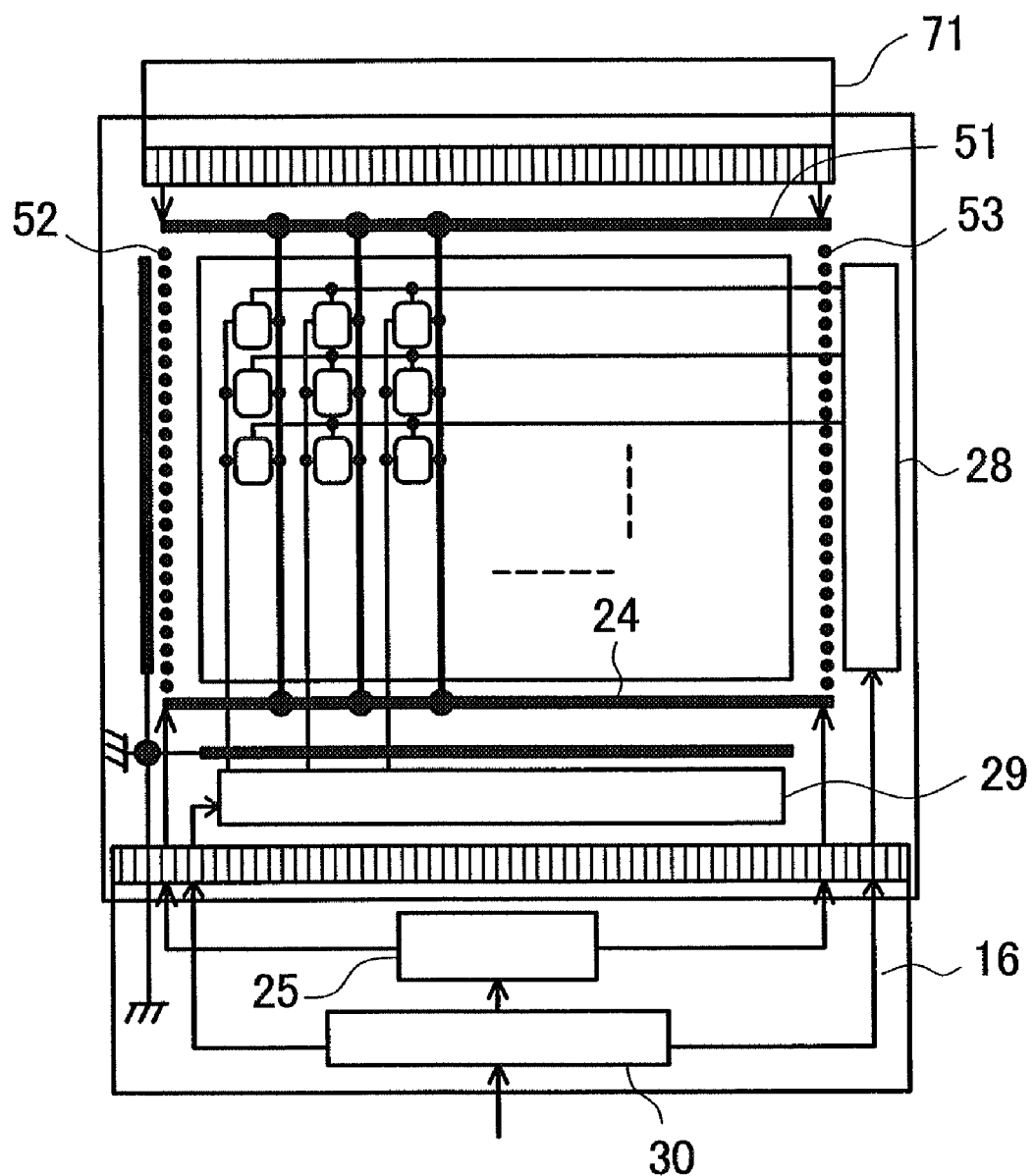
FIG. 7 is a drive circuit diagram of an organic EL display device of the fifth embodiment.

FIG. 7 is a drive circuit diagram of an organic EL display device of an embodiment 5 corresponding to FIG. 5 showing the embodiment 3. The constitution which makes this embodiment differ from the embodiment 3 lies in that a drive circuit includes an upper FPC 71 which supplies electricity from both ends of the upper power source bus line 51. Since other constitutions are substantially equal to the corresponding constitutions shown in FIG. 5, the detailed explanation is omitted.

In FIG. 7, a power source part substantially equal to a power source part 25 on a lower FPC 16 side is provided to an upper FPC 71 side, and electricity is supplied to both ends of the upper power source bus line 51 from this power source part on the upper FPC 71 side. The line resistance of the upper power source bus line 51 is reduced in the same manner as a lower power source bus line 24. Here, a left power source bus line 52 and a right power source bus line 53 which connect the upper power source bus line 51 and the lower power source bus line 24 may be omitted.

In this embodiment, compared to the embodiment 3, the brightness inclination in the horizontal direction can be further reduced.

Embodiment 6

Figure 8:
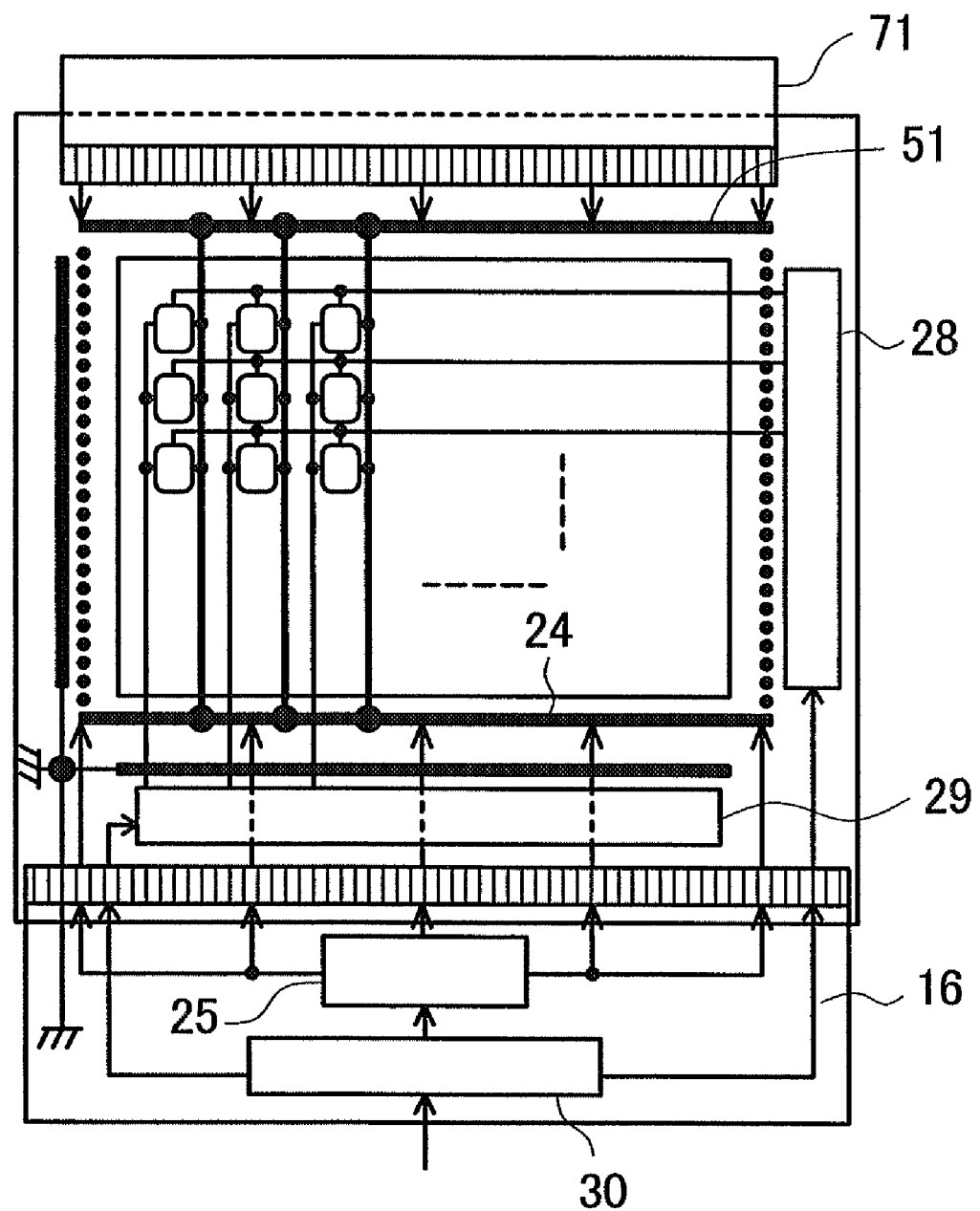
FIG. 8 is a drive circuit diagram of an organic EL display device of the sixth embodiment.

FIG. 8 is a drive circuit diagram of an organic EL display device of an embodiment 6 corresponding to FIG. 6 showing the embodiment 4. The constitution which makes this embodiment differ from the embodiment 4 lies in that a drive circuit includes an upper FPC 71 which supplies electricity to a plurality of portions including both ends of an upper power source bus line 51. Since other constitutions are substantially equal to the corresponding constitutions shown in FIG. 6, the detailed explanation is omitted.

In FIG. 8, a power source part substantially equal to a power source part 25 on a lower FPC 16 side is provided to an upper FPC 71 side, and electricity is supplied to a plurality of portions (five portions) including both ends of the upper power source bus line 51 from this power source part on the upper FPC 71 side. The line resistance of the upper power source bus line 51 is reduced in the same manner as a lower power source bus line 24.

In this embodiment, compared to the embodiment 4, the brightness inclination in the horizontal direction can be further reduced.

Embodiment 7

Figure 9:
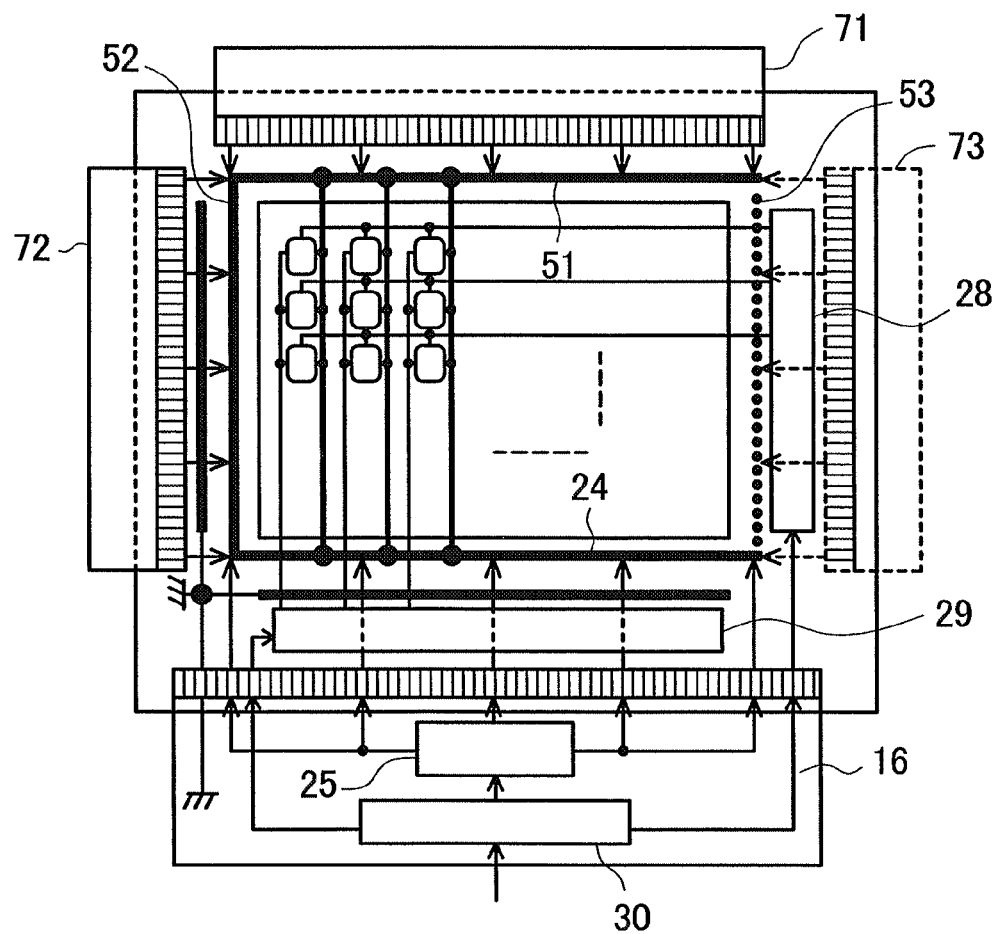
FIG. 9 is a drive circuit diagram of an organic EL display device of the seventh embodiment.

FIG. 9 is a drive circuit diagram of an organic EL display device of an embodiment 7 corresponding to FIG. 8 showing the embodiment 6. The constitution which makes this embodiment differ from the embodiment 6 lies in that left and right power source bus lines 52, 53 are provided with left and right FPCs 72, 73. Since other constitutions are substantially equal to the corresponding constitutions shown in FIG. 8, the detailed explanation is omitted.

In FIG. 9, a power source part substantially equal to a power source part 25 on a lower FPC 16 side is provided to an upper FPC 71 and a left FPC 72 (and a right FPC 73), and electricity is supplied to a plurality of portions (five portions) including both ends of an upper power source bus line 51 and a left power source bus line 52 (and a right power source bus line 53) from these power source parts. The line resistances of these upper power source bus line 51 and left power source bus line 52 (and right power source bus line 53) are reduced in the same manner as a lower power source bus line 24.

In this embodiment, the line resistances of the upper, lower, left and right power source bus lines can be reduced and hence, the brightness inclination attributed to the power source bus lines can be reduced to extremely small values.

The invention claimed is:

1. An organic EL display device comprising:
    a substrate having a display region;
    a flexible printed circuit connected to the substrate; and
    a drive circuit disposed on the substrate, wherein:
    the display region includes a plurality of pixels arranged in a matrix array, power source lines connected to the plurality of pixels, and data lines supplying data signals to the plurality of pixels,
    a power source bus line extends along a side of the display region and is connected to the power source lines,
    the power source bus line is arranged between the display region and the drive circuit,
    electric power is supplied from a power source part via the flexible printed circuit to a plurality of portions of the power source bus line, and
    a cathode contact is connected to cathodes of the plurality of pixels, and cathode electrons are supplied from between an edge of the substrate and the power source bus line via the cathode contact.

2. An organic EL display device according to claim 1, wherein
    the cathode contact is arranged opposite the power source bus line from the display region.

3. An organic EL display device according to claim 1, wherein
    the cathode contact is arranged between the power source bus line and the drive circuit.

4. An organic EL display device according to claim 1, wherein
    the cathode electrons are supplied to the cathode contact via the flexible printed circuit.

\* \* \* \* \*